US007822131B2

(12) United States Patent
Chen et al.

(10) Patent No.: US 7,822,131 B2
(45) Date of Patent: Oct. 26, 2010

(54) REDUCING A PEAK-TO-AVERAGE RATIO OF A SIGNAL

(75) Inventors: Ning Chen, Austin, TX (US); Jeffrey Keating, Austin, TX (US); James W. McCoy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 760 days.

(21) Appl. No.: 11/649,136

(22) Filed: Jan. 3, 2007

(65) Prior Publication Data

US 2008/0159422 A1 Jul. 3, 2008

(51) Int. Cl.
*H04L 27/28* (2006.01)
(52) U.S. Cl. ..................................... 375/260
(58) Field of Classification Search .............. 375/260, 375/296, 297, 135, 232; 370/480, 366
See application file for complete search history.

(56) References Cited

U.S. PATENT DOCUMENTS

| | | | | |
|---|---|---|---|---|
| 6,130,918 A * | 10/2000 | Humphrey et al. | ........... | 375/295 |
| 6,424,681 B1 | 7/2002 | Tellado et al. | | |
| 7,486,738 B2 | 2/2009 | Trivedi | | |
| 7,583,738 B2 * | 9/2009 | Yun et al. | .................... | 375/260 |
| 2003/0086507 A1 * | 5/2003 | Kim et al. | .................... | 375/297 |
| 2004/0165524 A1 | 8/2004 | Chen et al. | | |
| 2005/0089109 A1 | 4/2005 | Yun et al. | | |
| 2005/0100108 A1 | 5/2005 | Yun et al. | | |
| 2005/0157812 A1 | 7/2005 | Liu et al. | | |
| 2005/0238110 A1 | 10/2005 | Yun et al. | | |
| 2007/0004465 A1 | 1/2007 | Papasakellariou et al. | | |
| 2007/0189151 A1 | 8/2007 | Pan et al. | | |
| 2008/0043877 A1 | 2/2008 | Chen et al. | | |

OTHER PUBLICATIONS

Timothy A. Thomas, Paper Reduction Via a Fixed Frequency-Domain Weighting Across Multiple OFDM Bauds, IEEE 2004 IV 1081-1084.
Nadia Khaled, Quantized Multi-Mod Precoding for Spatial Multiplexing MIMO-OFDM Systems, IEEE, Jul. 2005, p. 867-870.
J.Armstrong. "Peak-to-average power reduction for OFDM by repeated clipping and frequency domain filtering",Electonic Letters, 2002.
Author Unknown, Motorola, RI-060392, "PA power de-rating reduction scheme for DFT-SOFDM and TO", Motorola TSG-RAN WG1#44.
Office Action dated Oct. 15, 2009 from U.S. Appl. No. 11/649,076.
Office Action dated Apr. 2, 2010 from U.S. Appl. No. 11/649,076.

* cited by examiner

*Primary Examiner*—Khai Tran
(74) *Attorney, Agent, or Firm*—Charles W. Bethards (57) ABSTRACT

Methods and corresponding systems for reducing a peak-to-average signal ratio include determining peak and null samples of a symbol. Thereafter, an error signal is calculated that is responsive to the peak and null samples. In one embodiment the error signal has values corresponding to differences between the peak samples and a high threshold and the null samples and a low threshold. In response to the error signal, a reserved tone set of time-domain samples are produced and added to a user data set of time-domain samples. The error signal can also be used to adapt a filter for filtering samples of a symbol.

20 Claims, 8 Drawing Sheets

REDUCING A PEAK-TO-AVERAGE RATIO OF A SIGNAL

RELATED APPLICATIONS

This application is related to U.S. application Ser. No. 11/649,076, filed on even date herewith by Chen et al., entitled "REDUCING A PEAK-TO-AVERAGE RATIO OF A SIGNAL USING FILTERING", which is hereby incorporated herein in its entirety by reference.

FIELD OF THE INVENTION

This invention relates in general to communication systems and equipment, and more specifically to techniques and apparatus for reducing a peak-to-average ratio of a signal.

BACKGROUND OF THE INVENTION

Multi-carrier modulation systems divide a transmitted bit stream into many different substreams, which are then sent over many different subchannels. Typically the subchannels are orthogonal under ideal propagation conditions. The data rate on each of the subchannels is much less than the total data rate, and the corresponding subchannel bandwidth is much less than the total system bandwidth. The number of substreams is chosen to ensure that each subchannel has a bandwidth less than the coherence bandwidth of the channel, so the subchannels experience relatively flat fading. This makes the inter symbol interference (ISI) on each subchannel small.

In more complex systems, which are commonly called orthogonal frequency division multiplexing (OFDM) systems (or multi-carrier or discrete multi-tone modulation systems), data is distributed over a large number of carriers (e.g., dozens or thousands) that are spaced apart at precise frequencies. The frequency spacing provides the "orthogonality," which prevents the demodulators from seeing frequencies other than their own. The benefits of OFDM are high spectral efficiency, resiliency to RF interference, and lower multi-path distortion. This is useful because in a typical terrestrial wireless transmission scenario there are multipath-channels (i.e. the transmitted signal arrives at the receiver using various paths of different length). Since multiple versions of the signal interfere with each other through inter symbol interference (ISI), it becomes very hard for the receiver to extract the originally transmitted data.

In one example of an OFDM transmitter, the data transfer process begins by encoding the data. The encoded data is often grouped in frames, where a frame represents a time-slice of the data to be transmitted. Bits or symbols from the frames are assigned to the subchannels based on the number of bits/symbols that each subchannel can support, and the subchannels are encoded by creating a frequency-domain vector set. Frequency-domain vectors in the vector set use phase and magnitude components to encode the values of the bits. An Inverse Fast Fourier Transform (IFFT) performs a frequency-to-time conversion of the frequency-domain vectors, resulting in digital time-domain information. A digital-to-analog converter (DAC) then converts the digital information to an analog signal for transmission (i.e., a transmit signal). The signal for transmission can then be transmitted by a transmitter, by either a wireline or a wireless transmitter. Many communications standards define the average power requirement of the signal for transmission, and in order to satisfy the power requirement, an amplifier is required.

OFDM/OFDMA technology has been adopted for use in various digital communications standards (e.g., IEEE 802.11a, IEEE 802.16e). Because the OFDM transmit signal is the sum of a large number of subcarriers, it may have a high peak-to-average power ratio (PAPR). In the transmit signal, peaks occur when the vectors in the frequency-domain vector set are combined through the IFFT. Each frequency-domain vector contributes to the magnitude of the time-domain signal, and if the frequency-domain vectors are such that their contributions are concentrated in one area of the time-domain signal, peaks can result.

One problem with transmitting a signal with a relatively high peak-to-average ratio is that portions of the signal may exceed a limited linear operating range of the transmitter (or the power amplifier in the transmitter), which can cause distortion, and, in turn, problems in the receiver with decoding the user data. Additionally, it can be costly to design and manufacture a power amplifier with a larger linear operating region. Some of the cost increase can be associated with the costs of more expensive higher quality components and higher capacity power supplies.

BRIEF DESCRIPTION OF THE DRAWINGS

The accompanying figures, wherein like reference numerals refer to identical or functionally similar elements throughout the separate views, and which together with the detailed description below are incorporated in and form part of the specification, serve to further illustrate various embodiments and to explain various principles and advantages, all in accordance with the present invention.

DETAILED DESCRIPTION

In overview, the present disclosure concerns methods and apparatus for reducing a peak-to-average ratio (PAR) of a signal for transmission in a communication system. More particularly, various inventive concepts and principles embodied in methods and apparatus can be used for reducing a peak-to-average power ratio of a multi-carrier signal for transmission in, e.g., an orthogonal frequency division multiplexing (OFDM) communication system.

While the techniques and apparatus for reducing a peak-to-average power ratio of particular interest may vary widely, one or more embodiments can be used in a wireless communications system having a transmitter using an OFDM or an OFDMA modulation scheme. However, the inventive concepts and principles taught herein can be applied to other broadband communications systems having communication links established in or transmitted in other media (e.g., a twisted-pair copper wire, a coaxial cable, or the like).

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit the invention in any manner. The invention is defined solely by the appended claims, including any amendments made during the pendency of this application, and all equivalents of those claims as issued.

It is further understood that the use of relational terms, if any, such as first and second, top and bottom, and the like, are used solely to distinguish one entity or action from another without necessarily requiring or implying any actual such relationship or order between such entities or actions.

Much of the inventive functionality and many of the inventive principles are best implemented with, or in, integrated circuits (ICs), including possibly application specific ICs, or ICs with integrated processing controlled by embedded software or firmware. It is expected that one of ordinary skill—notwithstanding possibly significant effort and many design choices motivated by, for example, available time, current technology, and economic considerations—when guided by the concepts and principles disclosed herein will be readily capable of generating such software instructions and programs and ICs with minimal experimentation. Therefore, in the interest of brevity and minimizing any risk of obscuring the principles and concepts according to the present invention, further discussion of such software and ICs, if any, will be limited to the essentials with respect to the principles and concepts of the various embodiments.

Figure 1:
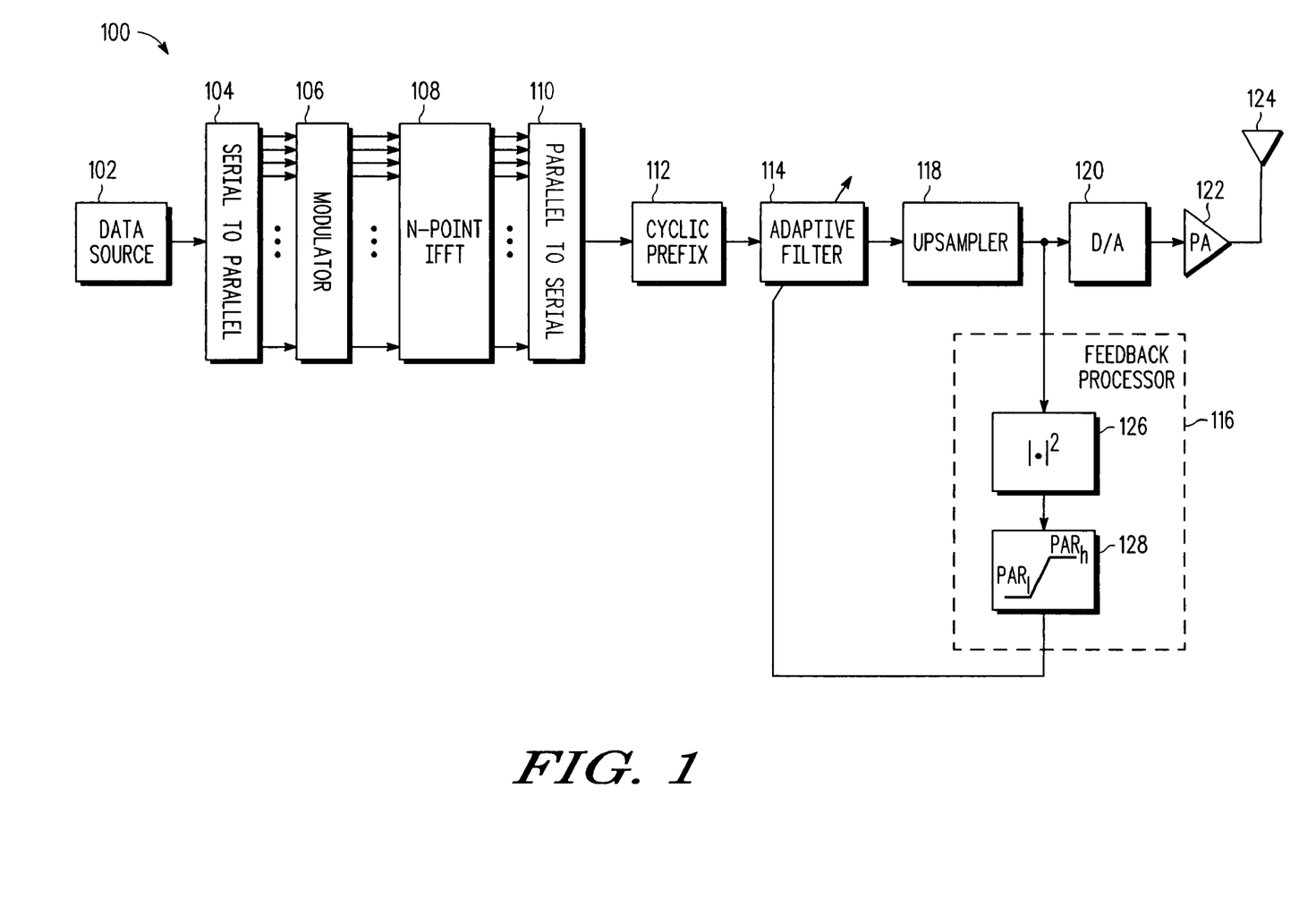
FIG. 1 depicts, in a simplified and representative form, a high-level block diagram of portions of a first embodiment of a discrete multi-carrier transmitter that can be used in a data communications system in accordance with one or more embodiments.

Referring to FIG. 1, a high-level diagram of portions of a transmitter, e.g., a discrete multi-carrier transmitter for use in a data communications system in accordance with one or more embodiments will be briefly discussed and described. In FIG. 1, multi-carrier transmitter 100 includes data source 102, which generates a data sequence, which can be considered "traffic data" or "user data" presented for transmission. In one embodiment, data source 102 can be, for example, an application running in a subscriber unit or a base station of a cellular communications system, wherein data from data source 102 can represent various forms of data for transmission, such as streaming media, or a data file to be transferred over a data communication network, or other similar data.

Data source 102 can be coupled to serial to parallel converter 104, which receives a serial stream of data bits and outputs parallel streams of data bits, wherein the variable N can be used to represent the number of parallel streams. The N parallel data bit streams can be coupled to inputs of modulator 106, which can map, or encode (e.g., Gray coding), each of the N parallel streams to a (possibly complex) symbol stream using some modulation constellation (e.g., quadrature amplitude modulation (QAM), phase-shift keying (PSK) modulation, or the like). In another embodiment, modulator 106 can include a precoding operation, such as, for example, a discrete Fourier transform (DFT), which can be used in a single carrier frequency division multiple access (SC-FDMA) system. The output of modulator 106 can be referred to as a "user frequency-domain data." Note that the constellations for the parallel data streams can be different, which means that some streams can carry a higher bit-rate than others.

The parallel symbol streams output by modulator 106 can be coupled to inputs of N-point Inverse Fast Fourier Transform (IFFT) 108. IFFT 108 receives a set of frequency-domain data (e.g., symbols or a frequency-domain vector set) and computes a set of complex time-domain data (e.g., samples), which samples can collectively be referred to as an "OFDM symbol." The IFFT correlates the frequency-domain input data with its orthogonal basis functions, which are sinusoids at certain frequencies. This correlation is equivalent to mapping the input data onto the sinusoidal basis functions. The set of data output by IFFT 108 can be referred to as a "user set of time-domain samples."

Outputs from IFFT 108 can be coupled to parallel-to-serial converter 110. Parallel-to-serial converter 110 receives time-domain samples and outputs a serial bit stream, which represents or corresponds to the waveform or signal that will be transmitted by multi-carrier transmitter 100. This signal can have a peak-to-average power ratio that exceeds a desired magnitude for a given power amplifier. Benefits of reducing the peak-to-average power ratio of this bit stream before it is amplified and transmitted can include lowering the cost of the power amplifier in the transmitter, and reducing distortion in the power amplifier. As used herein, the term "peak-to-average power ratio" can also include the concept of a "peak-to-average ratio," wherein the magnitude of the values comprising the signal are not squared to compute a power of the signal. The peak-to-average ratio of the signal can compare a peak magnitude value of the signal to an average magnitude value of the signal.

In order to mitigate the effects of fading and inter symbol interference, cyclic prefix adder 112 can be coupled to the output of parallel-to-serial converter 110 for adding a cyclic prefix to the time-domain sample, which cyclic prefix can complete the OFDM symbol.

In the embodiment shown in FIG. 1, the output of cyclic prefix adder 112, which can be referred to as "an input plurality of samples," can be coupled or input to adaptive filter 114, which filter can be used to reduce the peak-to-average power ratio of the serial bit stream signal that represents the OFDM symbol. Adaptive filter 114 can be implemented with a digital filter that performs digital mathematical operations according to a transfer function defined by filter coefficients. In one embodiment, adaptive filter 114 can be a finite impulse response (FIR) filter. Adaptive filter 114 can be "adapted" by receiving data from feedback system 116 that is used to set the filter function in response to an actual data stream. The function of feedback system 116 (which can also be referred to as a "feedback processor" as shown in FIGS. 1, 2, 3, and 4) is discussed in greater detail below.

The output of adaptive filter 114 can be coupled to upsampler 118, which upsamples the signal to increase the sampling rate of the signal. The output of upsampler 118, which can be referred to as "a plurality of samples," or "a transmit set of time-domain samples," can be coupled to digital-to-analog (D/A) converter 120 and to feedback system 116. D/A converter 120 converts a serial digital signal to an analog signal.

The analog signal output by DA converter 120 can be coupled to power amplifier 122, which amplifies the signal and provides a signal at the appropriate frequency and with power suitable for transmission. In one embodiment, the output of power amplifier 122 can be coupled to antenna 124 for wireless transmission. In an alternative embodiment, power amplifier 122 can be coupled to another medium for transmission (e.g., a coaxial television cable, a twisted pair telephone cable, or the like).

Feedback system 116, which can be implemented in software, or hardware, or a combination of both, can be used to analyze the OFDM symbol (e.g., the "plurality of samples" or the "transmit set of time-domain samples") prior to transmission and to produce an "error signal" (e.g., data) that is responsive to a peak-to-average power ratio of the signal representing the OFDM symbol. In one or more embodiments, feedback system 116 detects peaks and nulls (or high and low value samples) to produce an error signal, which error signal is used in varying embodiments to adjust (lower or decrease) a peak-to-average ratio of the signal representing the OFDM symbol. In one embodiment, feedback system 116 receives an OFDM symbol and computes the power of the signal using power computer 126. In one embodiment, power computer 126 takes the absolute value of a digital sample and squares it. In an alternative embodiment, feedback system 116 can use a magnitude computer, which merely determines the absolute value of the sample, and does not square the value.

The output of power computer 126 can be coupled to comparator 128. Comparator 128 can identify one or more samples that either exceed a high threshold $PAR_h$ (e.g., peak samples) or fall below a low threshold $PAR_1$ (e.g., null samples). The output of comparator 128 can be a matrix (or indexed values, or an indexed vector) that points to samples in the upsampled OFDM symbol that either exceed the high threshold or fall below the low threshold, and in some embodiments corresponding data that indicates the magnitude of the excess (e.g., the extent or magnitude) either above the high threshold $PAR_h$ (which can be represented by a positive value) or below the low threshold $PAR_1$ (which can be represented by a negative value).

In one embodiment, the error signal output by comparator 128 in feedback system 116 can be used in adaptive filter 114 to calculate new filter coefficients, which changes the filter's response and thus improve the filter's effectiveness in reducing the peak-to-average power ratio of the data comprising the OFDM symbol.

With regard to processors and processing resources in multi-carrier transmitter 100, in various embodiments multi-carrier transmitter 100 can use one or more processors. If more than one processor is used, the processors and processing tasks can be divided among the functional blocks shown in FIG. 1 in many different ways according to various design requirements and preferences.

Figure 8:
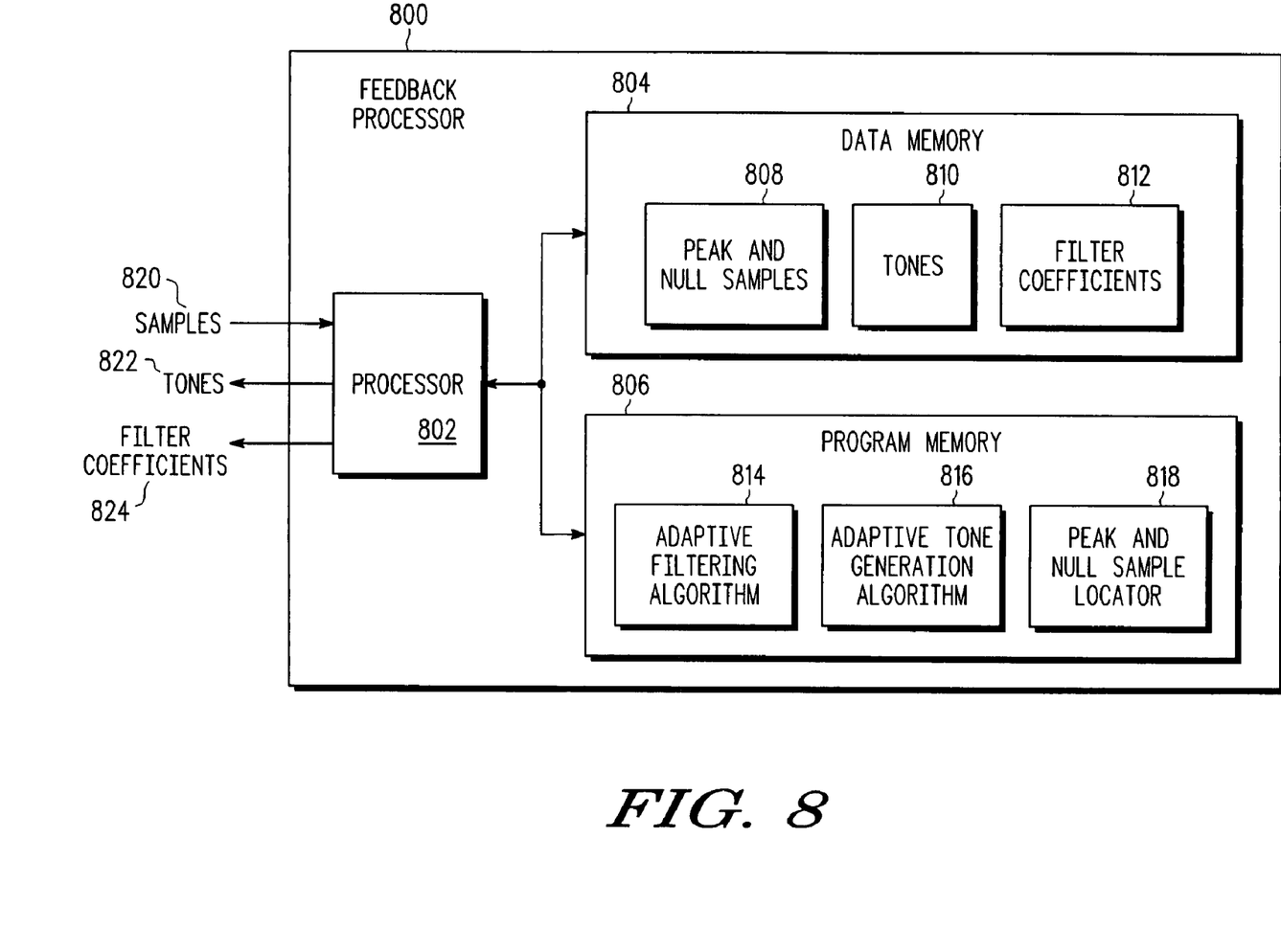
FIG. 8 shows, in a simplified and representative form, a high-level block diagram of portions of a feedback system of a discrete multi-carrier transmitter in accordance with one or more embodiments.

As an example of one embodiment of processing resources, FIG. 8 shows data processor 800, which can be used in various embodiments of the discrete multi-carrier transmitters (e.g., 100, 200, 300, and 400, which are shown in FIGS. 1, 2, 3, and 4). Data processor 800 can include processor 802, which can be implemented by a variety of known data processors or microcontrollers or signal processors or a combination of such processors. Processor 802 can be coupled to data memory 804 and program memory 806. Data memory 804 can be used to store signal samples, such as peak and null samples 808, and data representing tones 810 for transmission on a subcarrier, and filter coefficients 812, and other similar data, variables, parameters, intermediate data, and the like.

Program memory 806 can be used to store programs, software, or other instructions for implementing various modules, functions, and algorithms. For example, memory 806 can store software for implementing adaptive filtering algorithm 814, software for implementing adaptive tone generation algorithm 816, software for implementing peak and null sample locator 818, and other software for implementing other functions and algorithms.

Processor 802 can also be coupled to other data sources within the various multi-tone transmitters, such as samples 820 (e.g., data that represents time-domain data needed in the analysis and reduction of the peak-to-average power ratio), and the like. Processor 802 can also be coupled to other functional modules and blocks for receiving data or for is supplying data output by processor 802, such as tones 822 (e.g., data representing reserved tones), and filter coefficients 824 (e.g., data representing filter coefficients for use in a digital signal filter), and the like.

Figure 2:
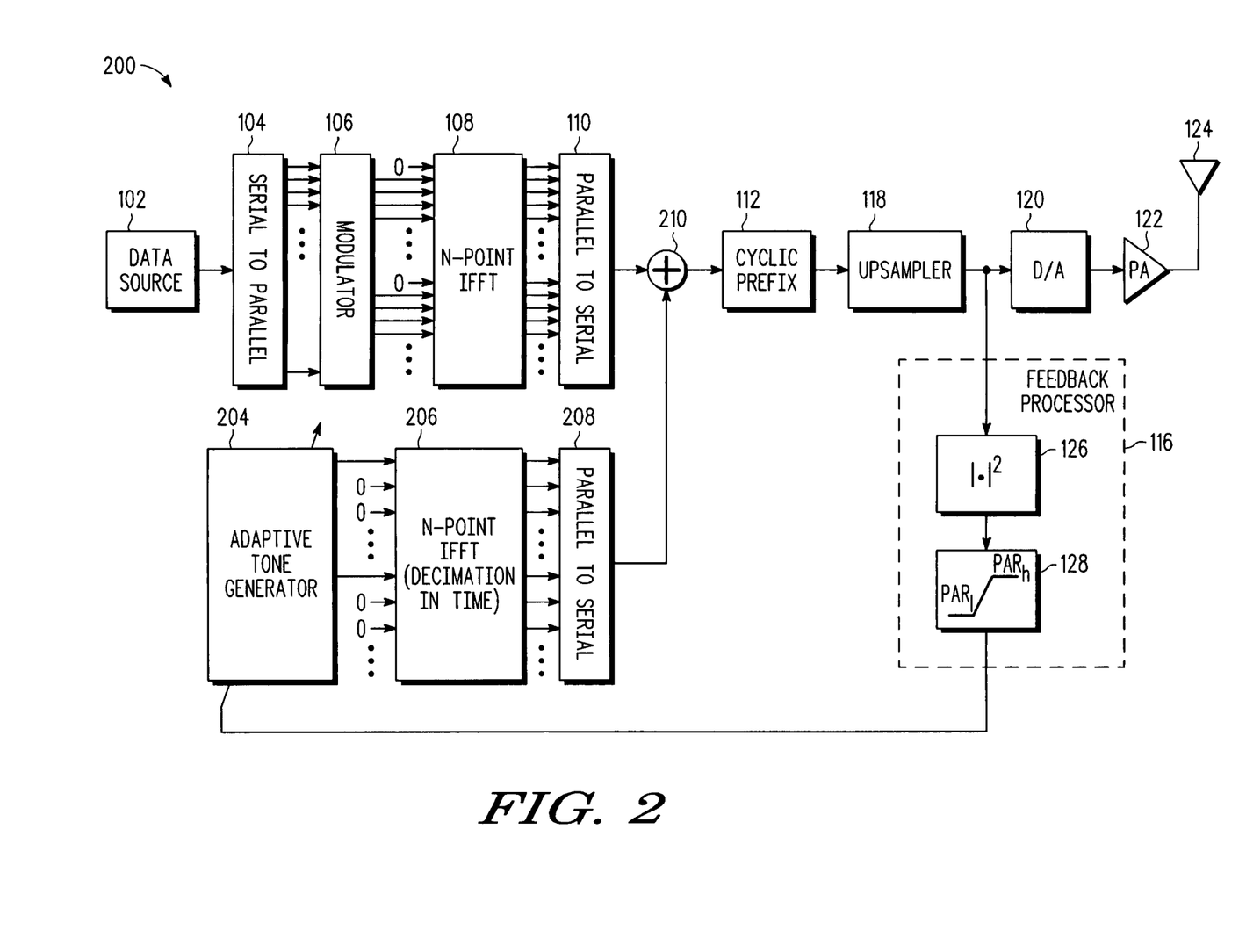
FIG. 2 shows, in a simplified and representative form, a high-level block diagram of portions of a second embodiment of a discrete multi-carrier transmitter in accordance with one or more embodiments.

Referring now to FIG. 2, there is depicted a second embodiment of a transmitter system, e.g., a multi-carrier transmitter 200 that uses novel tone reservation techniques to reduce a peak-to-average power ratio of a transmit signal in accordance with one or more embodiments. Many of the modules or functional blocks of the first embodiment of discrete multi-carrier transmitter 100 (shown in FIG. 1) can also be used in the second embodiment (shown in FIG. 2), wherein similar functions or modules have the same reference numerals. For example, data source 102, serial-to-parallel converter 104, modulator 106, N-point IFFT 108, parallel-to-serial converter 110, and cyclic prefix adder 112 are all functional blocks similar to those described above. Similarly, upsampler 118, digital-to-analog converter 120, power amplifier 122, and antenna 124 are all similar to corresponding functional blocks described above.

In multi-carrier transmitter 200 of FIG. 2, an error signal output from feedback system 116 (e.g., an output of comparator 128 in feedback system or feedback processor 116) can be used in adaptive tone generator 204 to generate adapted tones, which are then used to reduce the peak-to-average power ratio of the upsampled OFDM symbol data stream output by upsampler 118. The adaptive tones are signals (e.g., serial data streams) that are used for transmission on selected subcarriers for the purpose of reducing a peak-to-average power ratio of the transmit signal, rather than for transferring user data. Outputs of adaptive tone generator 204 can be coupled to inputs of N-point IFFT 206, which is similar to the N-point IFFT 108, and which is used to convert the frequency-domain data of the adapted tones to a set of complex time-domain data. Inputs of N-point IFFT 206 that are not connected to an output of adaptive tone generator 204 can be set to zero. Note that a modulator located between adaptive tone generator 204 and IFFT 206 is not needed because data output by adaptive tone generator 204 does not represent user data that must be correctly demodulated. Data output by adaptive tone generator 204 does not need to conform to a phase and magnitude constellation of a typical encoder in—it can have any phase and any magnitude below a maximum magnitude.

Note that selected inputs corresponding to selected subcarriers of N-point IFFT 108 are set to zero. Such selected inputs correspond to subcarriers carrying adapted tones output by adaptive tone generator 204. For example, the first input of N-point IFFT 108 is set to zero, which corresponds to the first input of N-point IFFT 206, which receives a tone from adaptive tone generator 204. As illustrated, other selected inputs of N-point IFFT 108 can also be set to zero. Note that in the embodiment shown in FIG. 2 the number N equals the number of outputs of modulator 106 plus the number of tones generated by adaptive tone generator 204, which number can be represented by M.

Data output from N-point IFFT 206 is coupled to inputs of parallel-to-serial converter 208, which takes parallel time-domain samples and converts them to a serial bit stream.

The serial bit stream output by parallel-to-serial converter 208 can be added to the serial bit stream output by parallel-to-serial converter 110 by adder 210, which adds the data sample-by-sample. Data output by parallel-to-serial converter 208 is added in order to reduce the peak-to-average power ratio of the signal output by upsampler 118. This means that data output by parallel-to-serial converter 208 and carried by the extra subcarriers is extra data that will be discarded at the receiver because it does not carry user data.

The output of adder 210 can be coupled to the input of upsampler 118, which upsamples the data to increase the sampling rate. Upsampled data can be coupled to feedback system 116, and to D/A converter 120, which has an output coupled to power amplifier 122. Following power amplifier 122, the signal can be coupled to antenna 124 (or another transmission medium) for transmission.

Figure 3:
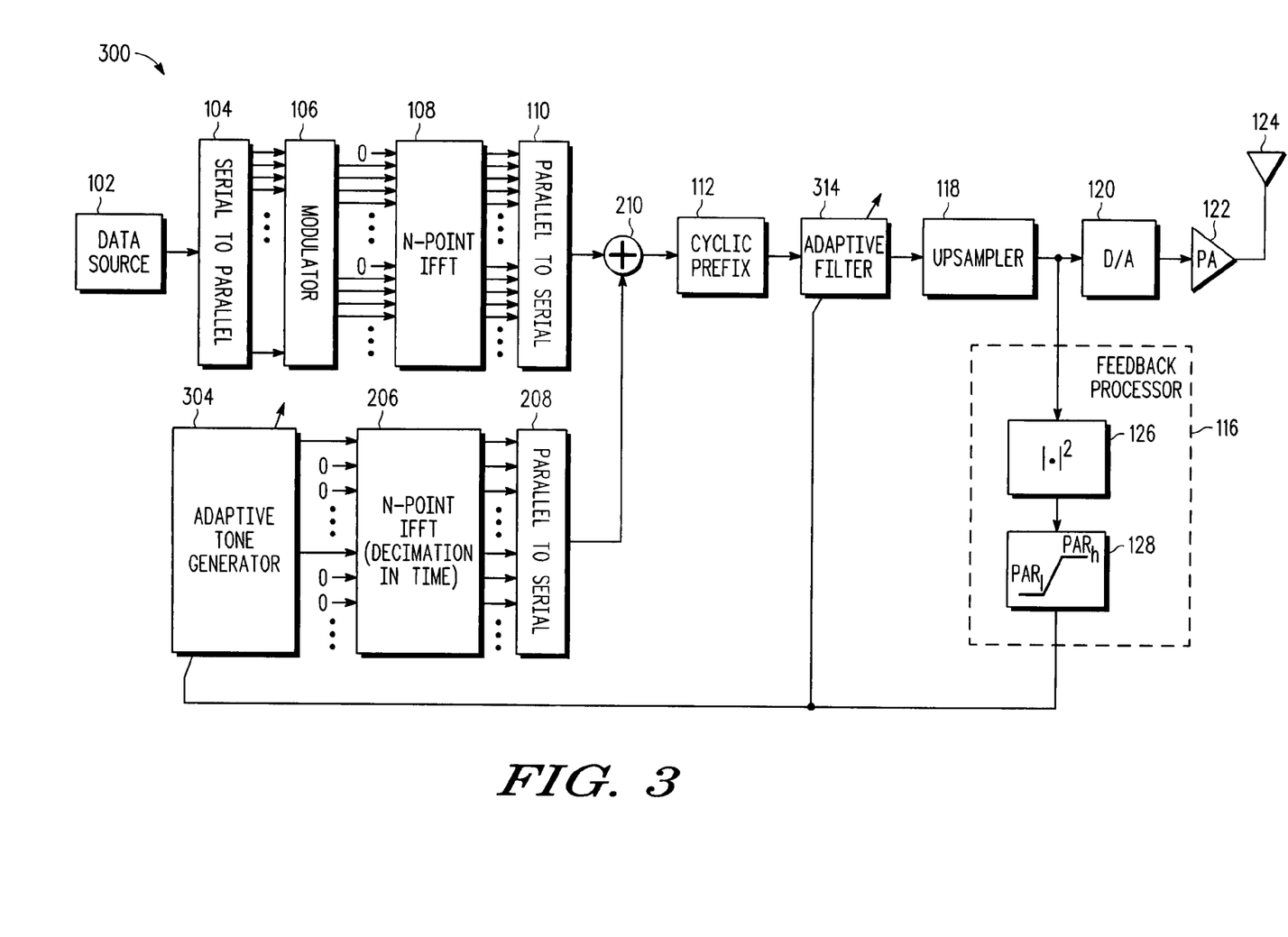
FIG. 3 shows, in a simplified and representative form, a high-level block diagram of portions of a third embodiment of a discrete multi-carrier transmitter in accordance with one or more embodiments.

Referring now to FIG. 3, there is depicted a high level diagram of portions of a discrete multi-carrier transmitter 300, which combines adaptive filtering techniques and adaptive tone reservation techniques to reduce a peak-to-average power ratio of a transmit signal in a data communications system in accordance with one or more embodiments. In FIG. 3, multi-carrier transmitter 300 includes many of the same components or modules shown in FIGS. 1 and/or 2, wherein similarly numbered components can have similar function and implementation. For example, data source 102, serial-to-parallel converter 104, modulator 106, N-point IFFT 108, parallel-to-serial converter 110, and cyclic prefix adder 112 are all functional blocks similar to those described above. Similarly, adder 210, adaptive filter 114, upsampler 118, digital-to-analog converter 120, power amplifier 122, and antenna 124 are all similar to corresponding functional blocks described above.

In multi-carrier transmitter 300, feedback system 116 (which can also be shown as feedback processor 116) produces an error signal that is responsive to peak samples and null samples and that can be coupled to both adaptive filter 114 and adaptive tone generator 204, so that adaptive filtering techniques and adaptive tone reservation techniques can be combined and operate together to reduce the peak-to-average power ratio of the transmitted signal.

As shown, feedback system 116 (or feedback processor 116) can be similar to the feedback system module used in FIGS. 1 and 2. Power computer 126 can receive a signal from upsampler 118 and outputs the value representing the power of the signal. As mentioned above, in another embodiment, a magnitude computer can be substituted to calculate the magnitude of the signal rather than the power of the signal. The output of power computer 126 can be coupled to comparator 128, which compares the power level (or the magnitude) to both a high threshold and a low threshold (e.g., $PAR_h$ and $PAR_l$), and outputs indexed values (e.g., a matrix of indexed values) that represent the indexed excess above the high threshold (for peak samples) or the indexed excess below the low threshold (for null samples), as positive and negative values, respectively.

The output of comparator 128, which is the error signal proportional to or responsive to the peak-to-average power ratio of the signal, can be coupled to both adaptive filter 314 and adaptive tone generator 304 in order to support the two methods or techniques of reducing the peak-to-average power ratio of a transmit signal (i.e., adaptive filtering techniques and adaptive tone reservation techniques). Thus, adaptive filter 314 receives the error signal and calculates new filter coefficients, and adapted tone generator 304 receives the signal and calculates a new set (e.g., as set of M number) of reserved tones. Note that due to interaction between the joint adaptive processors, the updating algorithms in adaptive filter 314 and adaptive tone generator 304 are different from their counterparts 114 and 204, respectively. The newly-calculated reserved tones are input into N-point IFFT 206, which takes frequency-domain data and calculates time-domain data. The time-domain data is then input into parallel-to-serial converter 208, which outputs a serial time-domain data stream derived from the reserved tones, which data stream can be added by adder 210 to the user data serial data stream output by parallel-to-serial converter 110.

The output of adder 210 can then be filtered by adaptive filter 314 to further reduce the peak-to-average power ratio of the signal using filter coefficients derived or calculated from the same error signal used to create the reserved tones.

After adding the data derived from the reserved tones at adder 210 and filtering the signal at adaptive filter 314, the output of adaptive filter 314 can be coupled to upsampler 118, which upsamples the data to increase the sampling rate. Following upsampler 118, D/A converter 120 and power amplifier 122 can be used to process the signal for transmission via antenna 124, or via some other medium.

Figure 4:
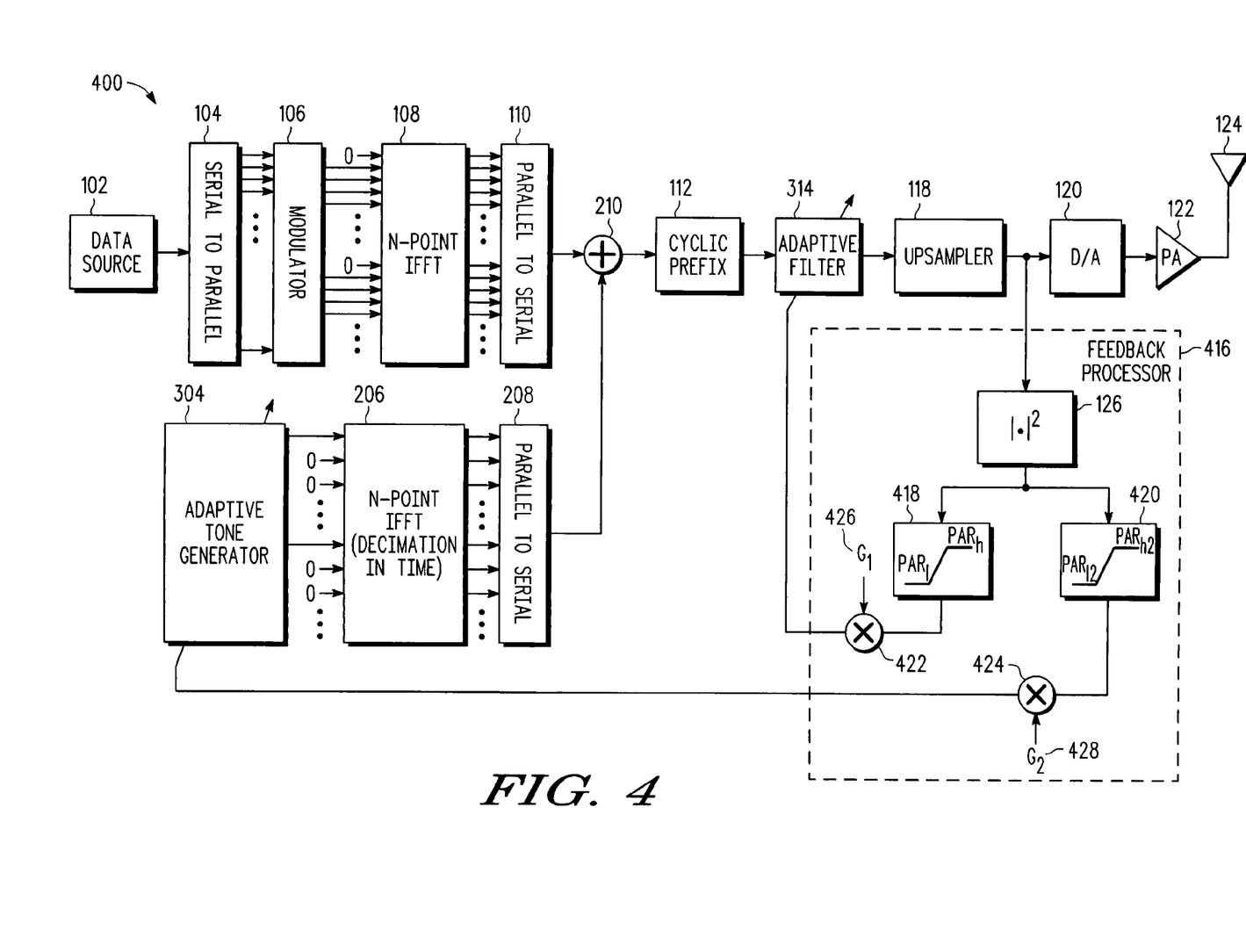
FIG. 4 depicts, in a simplified and representative form, a high-level block diagram of portions of a fourth embodiment of a discrete multi-carrier transmitter in accordance with one or more embodiments.

With reference now to FIG. 4, there is depicted a high level diagram of portions of a discrete multi-carrier transmitter 400, which combines adaptive filtering techniques and adaptive tone reservation techniques to reduce a peak-to-average power ratio of a transmit signal in a data communications system in accordance with one or more embodiments. In FIG. 4, multi-carrier transmitter 400 includes many of the same components or modules that are shown in FIG. 3, wherein similarly numbered components can have similar function and implementation. For example, the components that make up the front end of multi-carrier transmitter 400 (i.e., data source 102, serial-to-parallel converter 104, modulator 106, N-point IFFT 108, parallel-to-serial converter 110, and cyclic prefix adder 112) can all be functional blocks similar to those described above with reference to FIGS. 1, 2, and 3. Similarly, the components on the back end of multi-carrier transmitter 400 (i.e., upsampler 118, digital-to-analog converter 120, power amplifier 122, and antenna 124) can all be similar to those functional blocks described above with reference to FIGS. 1, 2, and 3. Adaptive filter 314 can be similar to the adaptive filter described above with reference to FIG. 3, adaptive tone generator 304 can be similar to the adaptive tone generator described above with reference to FIG. 3, and adder 210 can be similar to adder 210 described above with reference to FIGS. 2 and 3.

Both FIGS. 3 and 4 illustrate discrete multi-carrier transmitters (300 and 400) that combine two methods of reducing a peak-to-average power ratio of a transmit signal. However, one difference between FIG. 3 and FIG. 4 is that feedback system 416 (or feedback processor 416) can include two comparators 418 and 420. Comparator 418 can use a first pair of high and low thresholds (e.g., $PAR_h$ and $PAR_l$) to produce an error signal that is fed back to adaptive filter 314, and comparator 420 can use a second pair of high and low thresholds (e.g. $PAR_{h2}$ and $PAR_{l2}$) to produce an error signal that is fed back to adaptive tone generator 304. The use of different thresholds for adaptive filter 314 and adaptive tone generator 304 allows the different methods of reducing a peak-to-average power ratio of the transmit signal to operate on different components or characteristics of the signal, such as the peaks of the signal or the nulls of the signal. The different thresholds can also allow the two methods to operate at different strengths or different levels of effectiveness to reduce the peak-to-average power ratio. For example, to disable adaptive filtering, the initial value of the filter coefficients can be set to [1, 0, . . . , 0], and upper threshold $PAR_h$ can be set to a large value (e.g., a value that is higher than the maximum possible peak power (with an almost 1 probability)) and lower threshold $PAR_l$ set to zero. Situations in which adaptive filtering should be turned off or reduced can include situations where stringent distortion levels are required at the receiver and the adaptive filter would impose a more difficult equivalent channel to the receiver. In this case, more weight should be given to the adaptive tone generator to reduce the peak-to-average power ratio of the transmit signal.

Another difference between FIGS. 3 and 4 is the presence of gain blocks 422 and 424, which can be used to adjust the gain of error signals output by comparators 418 and 420 by gain settings 426 and 428, respectively. Adjusting the gains (e.g., $G_1$ and $G_2$) of these error signals can change the relative strengths, or effectiveness, or aggressiveness of the methods of reducing the peak-to-average power ratio. In some embodiments, the gain of one method or the other can be set to zero in order to switch between (e.g., turn off) the two methods of reducing the peak-to-average power ratio, wherein switching between the two methods can be based upon the desired strength level for each method, the amount of bandwidth overhead available (for tone reservation), the peak-to-average power ratio of the signal itself (if high, both methods may be operating at max. strengths), the interference/distortion tolerance level of the receiver (the adaptive filtering may introduce distortions), and the channel conditions (e.g., if severe channel conditions exist, there can be a tendency to reduce or eliminate the amount of filtering), etc. Adjusting gains 426 and 428 in FIG. 4 can have effects similar to adjusting the two sets of upper/lower thresholds (e.g., $PAR_h$ and $PAR_l$ and $PAR_{h2}$ and $PAR_{l2}$), which effects are described above.

Figure 5:
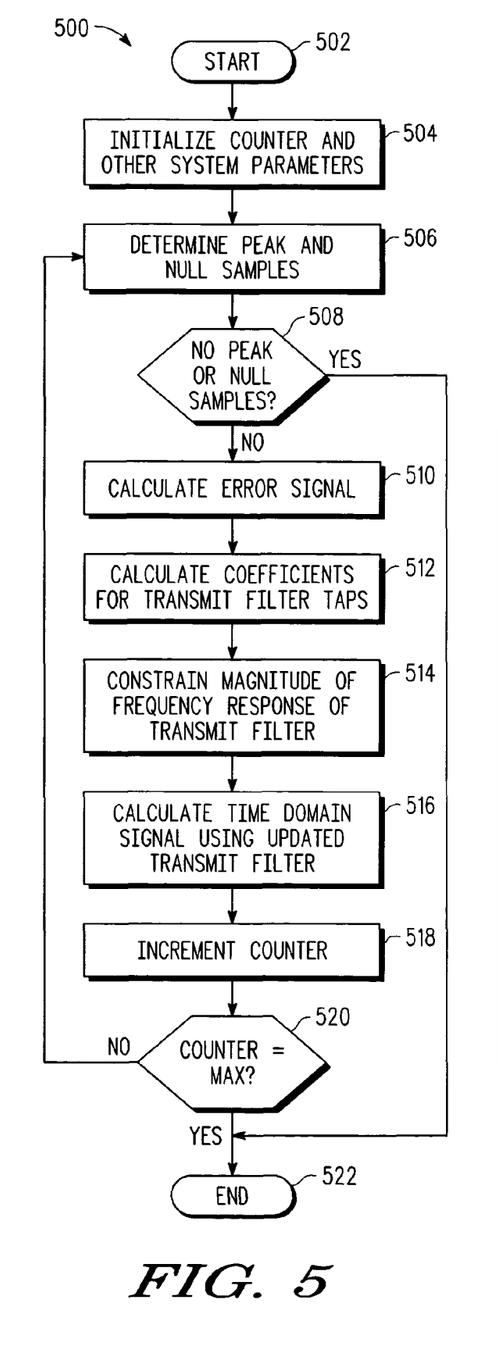
FIG. 5 is a high-level flowchart of processes that can be executed in one or more embodiments of a discrete multi-carrier transmitter.

With reference now to FIG. 5, there is depicted a high-level flowchart of processes that can be executed by multi-carrier transmitters 100, 300, 400 shown in FIGS. 1, 3, 4 in accordance with one or more embodiments. As illustrated, the process begins at 502, and thereafter continues at 504, wherein the process initializes a counter and other system parameters. The counter can be used to count iterations or passes through the flowchart of FIG. 5, wherein coefficients are calculated for an adaptive filter, such as adaptive filter 114, 314 in FIGS. 1, 3, and 4. Other system parameters that are initialized can include the initial filter coefficients for adaptive filter 114, 314, the high and low peak-to-average power ratio thresholds and the filter adaptation step size, which can be set in one embodiment according to the parameter set:

$$\{2 \leq PAR_h \leq 4, 0 \leq PAR_l \leq 1, 0.02 \leq \mu \leq 0.05\}$$

where $PAR_h$ is the upper threshold for the peak-to-average power ratio, and $PAR_l$ is the lower threshold, and $\mu$ is the step size for adjustments used in the updating equation.

Initialization can also include calculation of the U-time upsampled time-domain OFDM/OFDMA signal (i.e., the signal at the output of upsampler 118), which can be represented by the mathematical expressions:

$$x=IFFT([X[0:N/2-1],0,\ldots,0,X[N/2:N-1]]^T, U \times N)$$

and $$\tilde{x}=x,$$

where $\tilde{x}$ is x filtered by adaptive filter 114.

Next, the process determines the peak and null samples, as depicted at 506. This can be implemented with a comparator function (e.g., comparator 128) that searches the serial OFDM symbol (e.g., the samples represented by the vector x) for values that either exceed a high threshold $PAR_h$ (peak samples) or fall below a low threshold $PAR_l$ (null samples). The output of this determining step can be a matrix containing one or more index values pointing to or indicating the samples that exceed $PAR_h$ or fall below $PAR_l$, and the values corresponding to the magnitude of the excess (or extent) above $PAR_h$ or below $PAR_l$.

After determining the peak and null samples and their magnitude, the process determines if the number of peak or null samples is zero, as illustrated at 508. If the number of peak or null samples is zero, the peak-to-average power ratio of the transmit signal is within an acceptable limit (as determined by $PAR_h$ and $PAR_l$), and no further processing to reduce the peak-to-average power ratio is needed. Therefore, the process passes to 522, where the process of reducing the peak-to-average power ratio ends for the OFDM symbol data under consideration. Note that the process of FIG. 5 can be repeated for each OFDM symbol data.

If there is one or more peak or null sample located at 508, the process calculates the error signal, as shown at 510. In one embodiment, the error signal can be a two column matrix, wherein the first column can be indices for samples exceeding $PAR_h$ or falling below $PAR_l$, and the second column can be values corresponding to the magnitude of the excess above $PAR_h$ (represented by positive values) or below $PAR_l$ (represented by negative values). In another embodiment, the matrix can be a length-N vector wherein the magnitudes of indexed values of samples falling between $PAR_h$ and $PAR_l$ are set to a zero value, and the magnitudes of indexed values falling outside of the range of $PAR_h$ to $PAR_l$ are set to a positive magnitude of the excess above $PAR_h$ or a negative magnitude of the excess (i.e., the extent) below $PAR_l$.

For example, the "peak locations" (e.g., the set $\tau_p$ of samples that exceed peak threshold $PAR_h$) can be determined and represented as:

$$\tau_p=\{n_l||\tilde{x}[n_l]|^2/P_{av}>PAR_h\},$$

where $P_{av}$ is the average power of the signal and $n_l$ is the index of the lth "peak". The "null locations" (e.g., the set $\tau_n$ of samples that fall below null threshold $PAR_l$) can be determined and represented as:

$$\tau_n=\{n_l||\tilde{x}[n_l]|^2/Pav>PAR_l\}$$

and $\tau = \tau_p \cup \tau_n$.

The error signal can be represented as:

$$d[l] = \begin{cases} |\tilde{x}[n_l]|^2 - PAR_h P_{av}, & \text{if } n_l \in \tau_p \\ |\tilde{x}[n_l]|^2 - PAR_l P_{av}, & \text{if } n_l \in \tau_n, \end{cases}$$

where d[l] is the lth element of the error vector d.

After calculating the error signal, the process calculates (e.g., updates) coefficients for the adaptive transmit filter taps, as illustrated at 512. In one embodiment, the filter coefficients can be updated according to the formula:

$$h=h-\mu F_L^H D_X^* F_\tau D_{x,\tau} d$$

where h is the transmit filter of length L, $\mu$ is the step size for adjustments, F is an N×UN matrix formed by deleting the middle (U−1)N rows of an UN×UN Discrete Fourier Transform (DFT) matrix, $F_\tau$ is the columns of F with indices $\tau$, $D_X^*$ is the conjugation of a diagonal matrix with diagonal vector X, X is the frequency-domain data vector of length N, $D_{x,\tau}$ is a diagonal matrix with diagonal $\tilde{x}(\tau)$, and d is the error signal vector. The process of updating the coefficients uses a technique that minimizes the mean squared error to derive a gradient. The gradient is then used to calculate (e.g., move in a direction of the gradient) new or updated filter coefficients.

Next, the process constraints the magnitude of the frequency response of h by using the formula:

$$H[k] = \begin{cases} \alpha e^{j\angle H[k]}, & \text{if } H[k] < \alpha \\ \beta e^{j\angle H[k]}, & \text{if } H[k] > \beta \\ H[k], & \text{otherwise} \end{cases}$$

and by calculating $\tilde{h}$=IFFT(H,N), h=$\tilde{h}$(1:L), where $\alpha$ and $\beta$ are the predetermined thresholds (e.g., constraint thresholds) for the minimum and maximum allowed magnitude responses of adaptive filter 114. This constraint on filter h ensures that channel distortion introduced by the filter does not excessively degrade the bit error rate (BER) performance.

After constraining the magnitude of the frequency response of h, the process calculates the time-domain signal using the updated transmit filter, as depicted at 516. The updated time-domain signal can be represented as:

$$\tilde{x}=\text{Filter}(x,h).$$

Next, the process increments the counter, as illustrated at 518, and determines whether the counter is equal to the maximum counter value, as shown at 520. If the counter value has not reached the maximum counter value, the process iteratively returns to 506, where the process begins again by determining the peak and null samples.

If at 520 the counter is equal to the maximum value for the number of passes through the flowchart shown in FIG. 5, the process for reducing the peak-to-average power ratio for the signal representing an OFDM symbol ends. The maximum number of passes can be limited to control processing delay so that the process of reducing the peak-to-average power ratio of the signal is performed in a limited amount of time that does not excessively delay the transmitting the OFDM symbol. The process shown in FIG. 5 can be repeated as needed for each subsequent OFDM symbol, or group of symbols, which are processed at one time.

Figure 6:
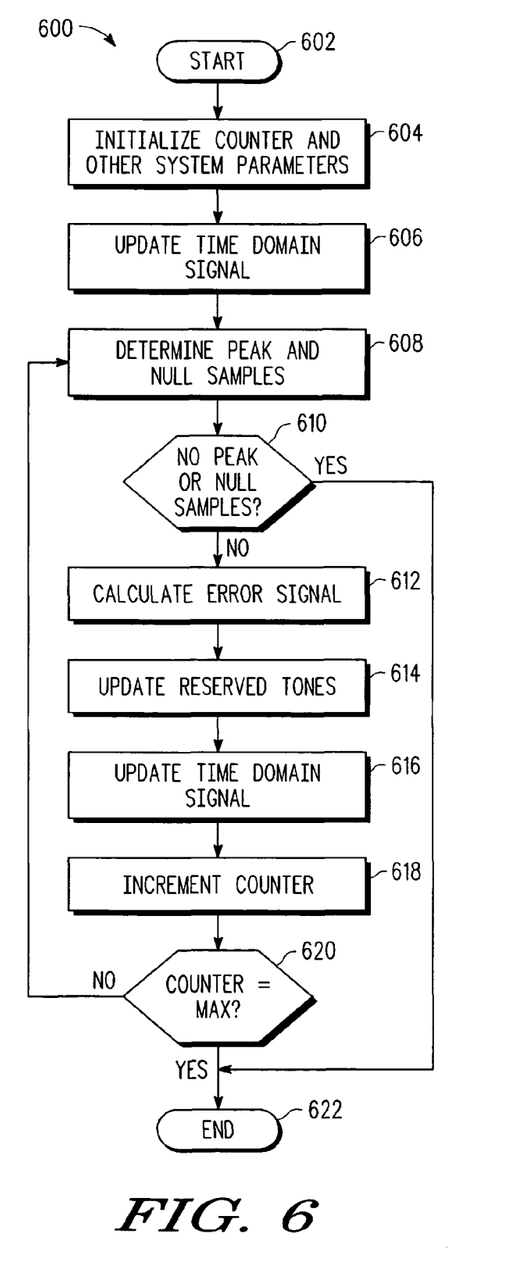
FIG. 6 is a high-level flowchart of processes that can be executed in one or more embodiments of a discrete multi-carrier transmitter.

With reference now to FIG. 6, there is depicted a high-level flowchart of processes that can be executed by multi-carrier transmitters 200, 300, and 400 shown in FIGS. 2, 3, and 4 in accordance with one or more embodiments. As illustrated, the process begins at 602, and thereafter continues at 604 wherein the process initializes a counter (e.g., set i=0) and other system parameters. The counter can be used to count iterations or passes through the flowchart of FIG. 6, wherein the process executes a limited number of attempts to calculate and add reserved tones to an OFDM symbol signal to reduce a peak-to-average power ratio of the transmit signal.

Other system parameters that can be initialized include, calculating the IFFT of the frequency-domain data vector X, wherein zeros (e.g., a zero input) are used on the subcarriers reserved for the adaptive tones. This calculation provides the time-domain data vector x.

Further initialization can include setting a vector B of M reserved tones to a random value as indicated by the formula:

$$B=randn(M,1)+jrandn(M,1).$$

Then B can be placed onto the reserved subcarriers with indices according to the formula:

$$\Re=\{k|k=iN/M,0\leq i\leq M-1\}$$

where k is the index of the reserved tones, M is the number of reserved tones, and $\Re$ is the set of indices.

Figure 9:
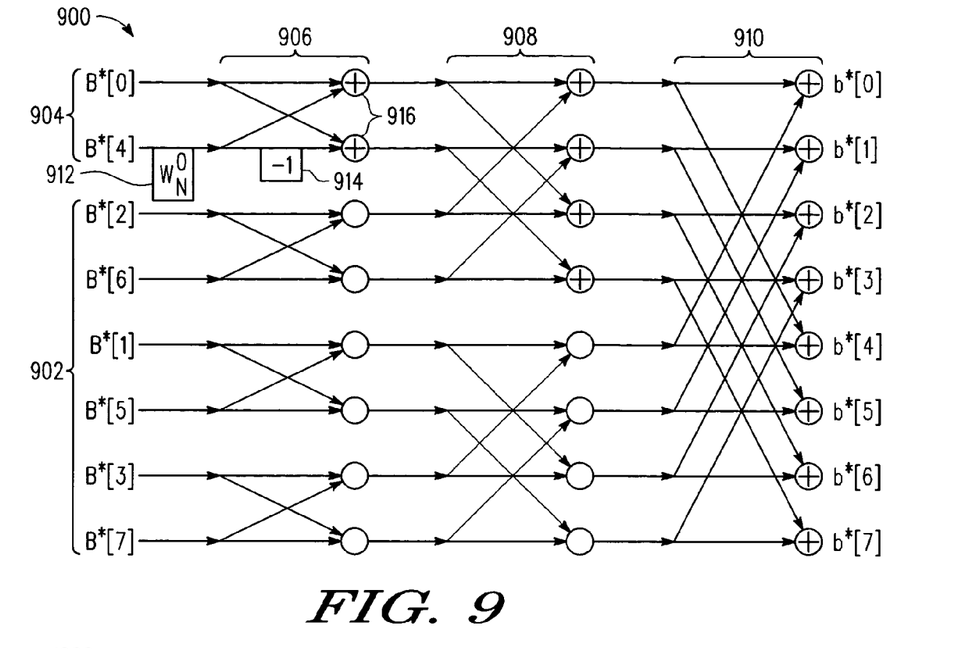
FIG. 9 depicts a butterfly structure used in an algorithm for computing a decimation in time inverse fast Fourier transform (IFFT) in accordance with one or more embodiments.

Further initialization can include calculating a length N IFFT of B to obtain b using the butterfly structure shown in FIG. 9, which implements a decimation in time N-point IFFT having inputs for reserved tones 904 and zeros 902 to fill in the inputs without reserved tones. In the example shown in FIG. 9, N is equal to 8 and the number of reserved tones, M, is equal to 2. Therefore, of the inputs into butterfly structure 900, 6 tones 902 have a zero input, while the reserved tone data 904 are input on the remaining two inputs.

Butterfly structure 900 illustrates how data (e.g., reserved tone data 904) is used in complex multiplications, sign changes, and addition operations to calculate an IFFT. For example, input B*[4] is an input to a complex multiplication 912, which is represented by the symbol $W_N^0$, where $$W_N^k = e^{-\left(i\frac{2\pi k}{N}\right)}.$$

Sign changes in butterfly structure 900 are indicated by "−1." The addition operations in butterfly structure 900 are indicated by a "+" symbol in a circular node of the trellis.

In FIG. 9, the particular inputs of butterfly structure 900 are carefully selected in order to reduce the number of complex multiplications, sign changes, and additions. Reducing these calculations reduces the time required to calculate the IFFT, and reduces the complexity of the circuitry or algorithms used to implement the IFFT calculation. As shown in FIG. 9, the inputs selected are inputs 0 and 4, which are evenly spaced inputs, and are inputs in the same subgroup at the first layer 906 of butterfly structure 900, wherein butterfly structure 900 has three layers 906, 908, and 910, and wherein the first layer has two inputs, 904 corresponding to B*[0] and B*[4].

Thus, inputs into butterfly structure 900 are all members of the same subgroup at the lowest-level layer that accommodates the number of reserved tones used. In a situation where four reserved tones are used (e.g., N=8 and M=4), the inputs that can be selected to reduce computational complexity are all members of the same subgroup in layer 2 908, which layer has 2 subgroups of 4 members each, wherein the first subgroup includes B*[0], B*[4], B*[2], and B*[6], and the second subgroup includes B*[1], B*[5], B*[3], and B*[7].

Figure 10:
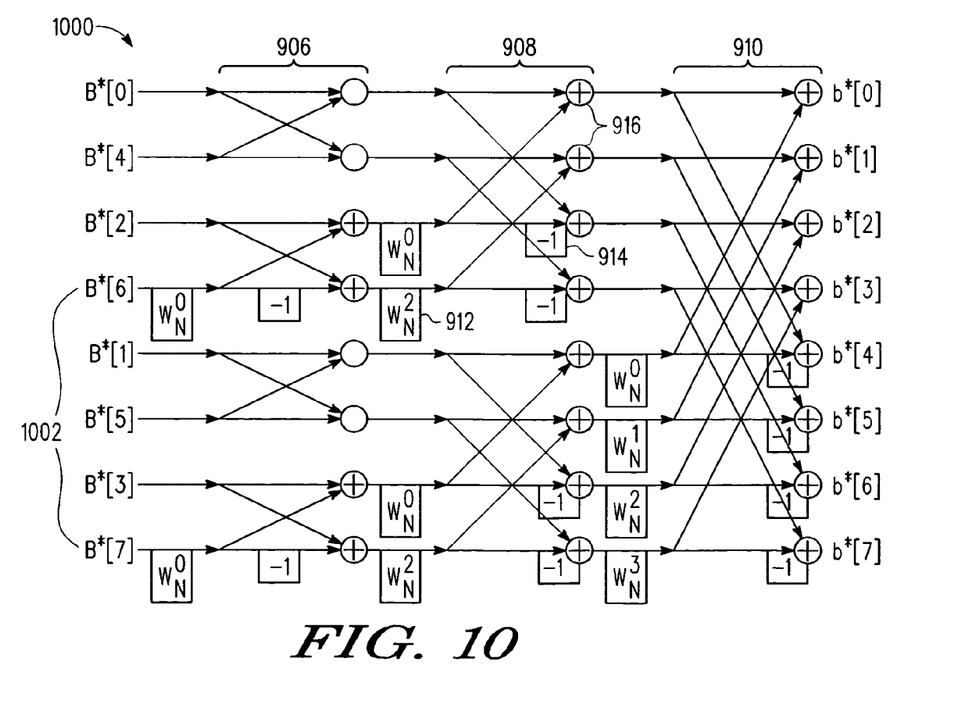
FIG. 10 depicts a butterfly structure used in an algorithm for computing a decimation in time IFFT according to the prior art.

FIG. 9 shows that when two inputs 904 are used for reserved tones and the remaining inputs 902 are set to zero, and when the inputs are selected with equal spacing among the IFFT inputs, and when the two inputs are members of the same subgroup at first layer 906, the IFFT can be calculated with a single complex multiplication operation (shown at 912), a single sign change (shown at 914), and 14 addition operations (which are shown by ⊕symbol 916). Compare this to butterfly structure 1000 shown in FIG. 10, wherein two inputs 1002 (i.e., B*[6] and B*[7]) are selected for reserved tones, and the two inputs are not equally spaced members of the same subgroup, the IFFT calculation requires 10 complex multiplications (such as 912), 10 sign changes (such as 914), and 20 addition operations (such as 916). Therefore, selecting the proper inputs for reserved tones on an N-point IFFT calculator can save a significant amount of computational resources in a multi-tone transmitter using reserved tones to reduce a peak-to-average power ratio of a signal.

The equally spaced selection of inputs for reserved tones on IFFT 206, and corresponding null values (e.g., zero values) on IFFT 108, can be generally expressed as selecting M of N inputs of a decimation-in-time IFFT having radix r that are members of a single subgroup at layer x of a butterfly structure used to implement the IFFT, wherein x=⌈$\log_r$ M⌉, wherein the function ⌈α⌉ is the ceiling function, which gives the smallest integer value ≧α.

Referring back to 604 in FIG. 6, still further initialization can include upsampling the time-domain data x+b according to the formula: x̃=Upsample(x+b, U), wherein U is the oversampling factor. Initialization can also include setting the upper and lower thresholds for the peak-to-average power ratio parameters and step size for adjustments. In one embodiment these parameters can be set as follows:

{$PAR_h$=3, $PAR_l$=0.5, μ=0.03}.

After initialization, the process updates the time-domain signal, as illustrated at 606. In one embodiment, updating the time-domain signal can be implemented by calculating N-point IFFTs in N-point IFFT calculators 108 and 206 (see FIG. 2). N-point IFFT 108 uses inputs from modulator 106 and selected inputs (i.e., inputs corresponding to reserved tones) set to zero, or a null value, while N-point IFFT 206 uses selected inputs from adaptive tone generator 204 and the remaining inputs set to zero, or a null value. The outputs of the N-point IFFT calculators 108 and 206 are converted to a serial data streams at parallel-to-serial converters 110 and 208, respectively, and then added together at adder 210. A cyclic prefix can be added at 112 to the output of adder 210, and the output of adder 210 can be upsampled by upsampler 118 to produce the time-domain signal denoted by vector x, which is ready for transmission.

Once the time-domain signal is updated, the process determines whether there are peak and null samples in the time-domain signal, as depicted at 608. Peak and null samples can be determined using feedback system 116, which includes a function for determining a magnitude (e.g., power computer 126) and a comparator for testing samples against a high threshold $PAR_h$ and a low threshold $PAR_l$. The high threshold is used to find peak values in the signal, while the low threshold is used to find lower-valued samples that lower the average magnitude of the signal, which samples also tend to raise the peak-to-average power ratio.

Next, the process determines if there are peak or null samples, as illustrated at 610. If there are no peak or null samples, the peak-to-average power ratio does not need reducing and the process passes to 622, which ends the process of updating reserved tones to reduce the peak-to-average power ratio of the transmit signal. If there are peak or null samples, the process passes to 612, wherein the error signal is calculated.

In one embodiment, the error signal is calculated and formatted as a matrix having indices corresponding to either a peak or a null sample location, and a magnitude corresponding to each peak or null location, wherein the magnitudes have positive values indicating the excess over the high threshold $PAR_h$ or negative values indicating the excess (i.e., the extent) below the low threshold $PAR_l$.

In response to the calculated error signal, the process updates the reserved tones as depicted at 614. Reserved tones can be updated according to the formula:

$$B = B - \mu F \cdot \mathbf{F}_{\mathfrak{R},\tau} D_{x,\tau} d$$

where
  B is a vector of M reserved tones;
  μ is a step size for adjustments;
  $\mathbf{F}_{\mathfrak{R},\tau}$ is a submatrix of F as F($\mathfrak{R},\tau$), where F is a N×UN DFT matrix formed by deleting the middle (U−1)N rows of an UN×UN DFT matrix;
  $D_{x,\tau}$ is a diagonal matrix with diagonal x̃(τ); and
  d is the error signal vector.

After updating the reserves tones, the process updates the time-domain signal using the newly calculated reserve tones, as illustrated at 616. In a preferred embodiment, updating the time-domain signal is implemented as described above with reference to 606, and as represented by the formula:

$$\tilde{x} = \text{Upsample}(x+b, U).$$

At 618, the process increments the counter, which is counting the passes through the flowchart of FIG. 6. At 620 the process determines whether the counter has reached its maximum value. If the maximum counter value has been reached, the process of reducing the peak-to-average power ratio ends at 622 for the signal representing the OFDM symbol.

If the counter has not reached the maximum value at 620, the process iteratively returns to 608, wherein the process again determines the peak and null samples for updating the error signal and the reserved tones. Note that the process depicted by the flowchart is repeated, if at all, for each OFDM symbol until a maximum number of passes has been executed, or until the peaks and nulls (as defined by thresholds $PAR_h$ and $PAR_l$) have been removed from the OFDM symbol. In one embodiment, the maximum number of passes can be five.

Figure 7:
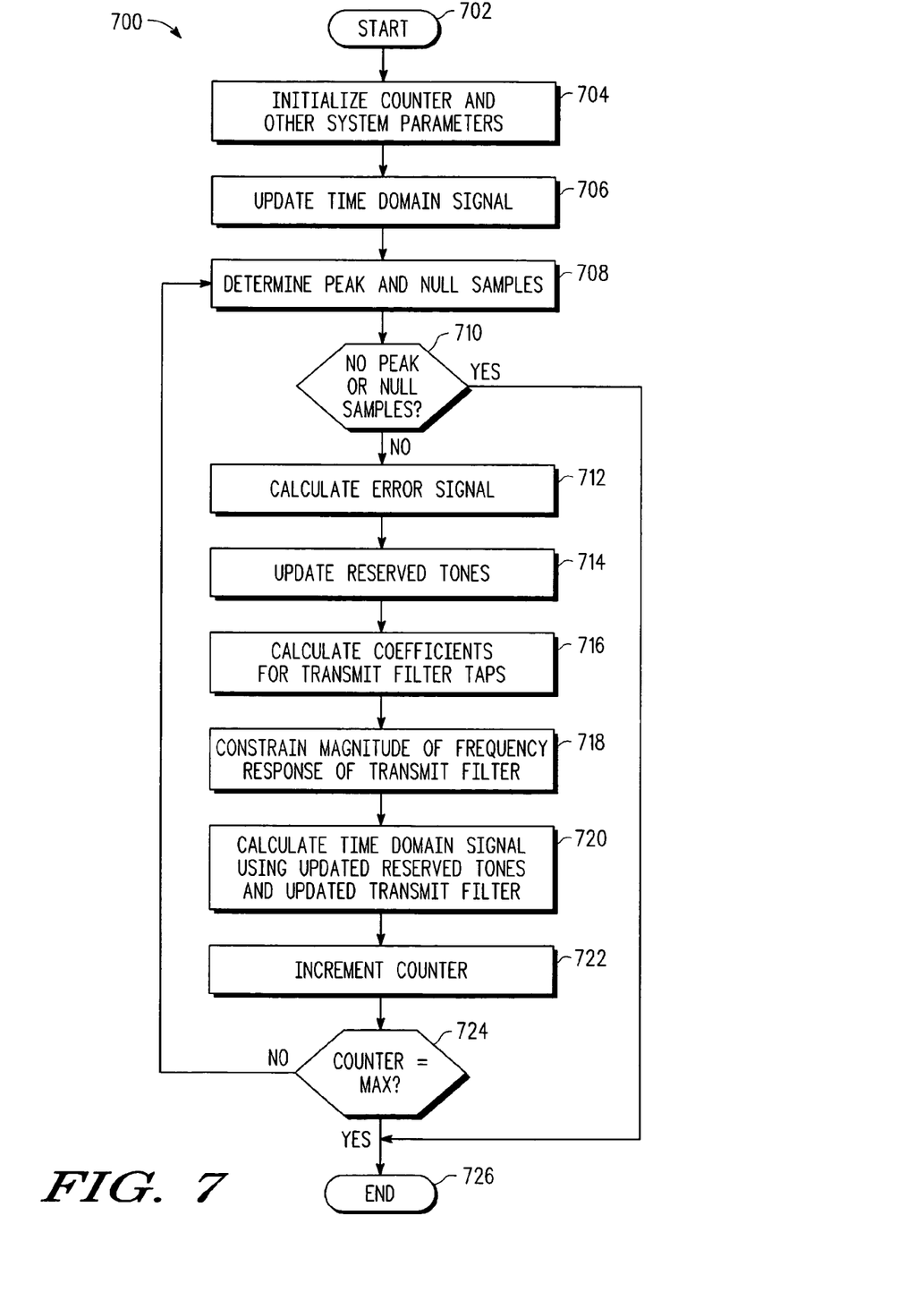
FIG. 7 is a high-level flowchart of processes that can be executed in one or more embodiments of a discrete multi-carrier transmitter.

Referring now to FIG. 7, there is depicted a high-level flowchart of processes that can be executed by multi-carrier transmitters 300 and 400 shown in FIGS. 3 and 4 in accordance with one or more embodiments. The flowchart of FIG. 7 includes a combination of more than one process or technique for reducing a peak-to-average power ratio of the signal for transmission in the multi-carrier transmitters 300 and 400 shown in FIGS. 3 and 4. As illustrated, the process begins at 702, and thereafter continues at 704 wherein the process initializes a counter (e.g., set i=0) and other system parameters. The counter can be used to count iterations or passes through the flowchart of FIG. 7, wherein the process executes a limited number of attempts to reduce a peak-to-average power ratio of the transmit signal representing an OFDM symbol so that the processing delay does not become excessive.

Other system parameters that can be initialized include the high and low peak-to-average power ratio thresholds and step size, which can be set according to the parameter set:

{2≦$PAR_h$≦4, 0≦$PAR_l$≦1, 0.02≦μ≦0.05} where $PAR_h$ is the upper threshold for the peak-to-average power ratio, and $PAR_l$ is the lower a threshold, and $\mu_1$ is the step size for adjustments used in the adaptive filter updating equation and $\mu_2$ is the step size for adjustments used in the reserved tone updating equation.

Other system parameters that can be initialized include the parameters associated with adaptive filter 314, such as the initial conditions for filter coefficients, which are described above with reference to 504 in FIG. 5.

Parameters for initializing adaptive tone generator 304 can also be set. Such parameters include an initial set of reserved tones, which are set as described above with reference to 604 in FIG. 6.

After initializing parameters for the combination of techniques used to reduce the peak-to-average power ratio, the process updates the time-domain signal, as depicted at 706. The updated time-domain signal is the result of filtering with initial filter coefficients used in adaptive filter 314, and the result of adding the initial reserved tones calculated by adaptive tone generator 304.

Once the time-domain signal has been updated, the process determines the peak and null samples, as depicted at 708. This can be implemented with one or more comparator functions (e.g., comparator 128 or comparator functions 418 and 420 as shown in FIG. 4.) that searches the serial OFDM symbol (e.g., the samples represented by the vector x) for values that either exceed a high threshold $PAR_h$ or fall below a low threshold $PAR_l$. The output can be a matrix containing one or more index values pointing to or indicating the samples that exceed $PAR_h$ or fall below $PAR_l$, and the values corresponding to the magnitude of the excesses (or extents) above $PAR_h$ or below $PAR_l$. The process represented by 708 is similar to processes 506 and 608, discussed above with reference to FIGS. 5 and 6.

Next, the process determines whether the number of peak or null samples is zero, as illustrated at 710. If the number is zero, this indicates that reducing the peak-to-average power ratio of the transmit signal is not necessary because the ratio is within acceptable limits. When reducing the peak-to-average power ratio is not necessary, the process passes to 726, wherein the process of reducing the peak-to-average power ratio for the signal representing the OFDM symbol under consideration ends. The processes of FIG. 7 can be repeated to reduce the peak-to-average power ratio for each OFDM symbol signal.

If, however, at 710 there are one or more peak or null samples identified, the process calculates the error signal, as depicted at 712. In one embodiment, the error signal indicates the location (e.g., using an index) of the peak or null sample, and either the magnitude of the excess above a high threshold $PAR_h$ with a positive value, or the magnitude of the excess below a low threshold $PAR_l$ with a negative value.

Next, the process updates the reserved tones, as illustrated at 714. Reserved tones can be updated according to the formula:

$$B = B - \mu_2 T_B^T D_H^* F \mathbf{F}_{\Re, \tau} D_\tau \mathbf{d}_d$$

where
 B is a vector of M reserved tones;
 $\mu_2$ is a step size for adjustments;
 $T_B^T$ is the transpose of the permutation matrix with ones on the reserved tone locations;
 $D_H^*$ is the conjugation of the diagonal matrix with H on its diagonal;
 H is the length N Fourier coefficient vector of h;
 $F_{\Re,\tau}$ is a submatrix of F as $F(\Re,\tau)$ where F is a N×UN DFT matrix formed by deleting the middle (U−1)N rows of an UN×UN DFT matrix;
 $D_{x,\tau}$ is a diagonal matrix with diagonal $\tilde{x}(\tau)$; and
 d is the error signal vector.

Thereafter, the process calculates updated coefficients for the transmit filter taps, as depicted at 716. The filter coefficients can be updated according to the formula:

$$h = h - \mu_f F_L^H D_{XB}^* F_\tau D_{x,\tau} d$$

where
 h is the transmit filter of length L;
 $\mu_f$ is the step size for adjustments;
 $F_L^H$ is the conjugate transpose of the first L columns of F;
 $D_{XB}^*$ is the conjugation of the diagonal matrix with X+B on its diagonal;
 H is the length N Fourier coefficient vector of h;
 $F_\tau$ consists of the columns of F with indices $\tau$;
 $D_{x\tau}$ is a diagonal matrix with diagonal $\tilde{x}(\tau)$; and
 d is the error signal vector.

After new filter tap coefficients have been calculated, the process constrains the magnitude of the frequency response of the transmit filter, as illustrated at 718. This process of constraining the magnitude of the frequency response can be implemented as described above with reference to 514 of FIG. 5.

Next, the process calculates the time-domain signal using updated reserved tones and updated transmit filter, as depicted at 720. This process provides a newly processed time-domain signal that represents an OFDM symbol at the output of upsampler 118. The OFDM symbol has been processed using a combination of tone reservation techniques and signal filtering techniques to reduce the peak-to-average power ratio of the time-domain signal.

After calculating a new time-domain signal, the process increments the counter, as illustrated at 722. The counter is used to limit the number of passes through the processing steps shown in FIG. 7 in order to limit the time spent processing the OFDM symbol before it is transmitted. At 724, the process determines whether the counter is equal to the maximum counter value. If the maximum counter value has been reached, the process passes to 726, wherein processing of the OFDM symbol to reduce the peak-to-average power ratio ends. If, however, the counter value at 724 has not reached the maximum value, the process iteratively returns to 708, wherein the process once again searches for peak and null samples to determine whether additional processing is appropriate or needed to further reduce the peak-to-average power ratio. Note that the process illustrated in FIG. 7 can be executed, as needed, for each OFDM symbol or combination of symbols.

In an alternative embodiment, the flowchart of FIG. 7 can include steps for adjusting the relative strength or effectiveness of the two or more methods used for reducing peak-to-average power ratio of the transmit signal. As described above with reference to FIG. 4, multiple comparator's (e.g., 418 and 420) can be used to generate different error signals using different threshold values (e.g., $PAR_h$ and $PAR_l$ and $PAR_{h2}$ and $PAR_{l2}$). The relative strength of the processing methods can also be changed using gain multipliers on the error signals (e.g., refer to gain blocks 422 and 424 and gain settings 426 and 428, respectively in FIG. 4). Changing the relative strength of the processing methods can be based upon the desired strength level for each method, the amount of extra frequency bandwidth available for reserved tones, the peak-to-average power ratio of the signal itself (if high, both methods may be operating at maximum strengths), the interference/distortion tolerance level of the receiver (channel distortions can be limited by reducing the amount of adaptive filtering), and the channel conditions (if severe channel conditions exist, there can be a tendency to reduce or eliminate filtering), and the like. The above described functions and structures can be implemented in one or more integrated circuits. For example, many or all of the functions can be implemented in the signal processing circuitry that is suggested by the block diagrams shown in FIGS. 1-4, and 8, and the butterfly structure data flow diagram of FIG. 9.

The processes, apparatus, and systems, discussed above, and the inventive principles thereof are intended to produce an improved and more efficient multi-carrier transmitter having a reduced peak-to-average power ratio of the transmit signal, wherein the peak-to-average power ratio is reduced by filtering techniques, or reserved tone techniques, or by a combination of both techniques. The reduction in the peak-to-average power ratio of the transmit signal can be made with relatively low cost and minimal added complexity. While the embodiments discussed above primarily relate to transmitting a radio frequency signal in a wireless communications system, this system for reducing a peak-to-average power ratio of the transmit signal, and processes therein, may be used in other data transmission applications, such as transmitting data via a wireline media, such as a wideband coaxial cable, twisted-pair telephone wire, or the like.

This disclosure is intended to explain how to fashion and use various embodiments in accordance with the invention, rather than to limit the true, intended, and fair scope and spirit thereof. The foregoing description is not intended to be exhaustive or to limit the invention to the precise form disclosed. Modifications or variations are possible in light of the above teachings. The embodiment(s) were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method for reducing a peak-to-average ratio of a signal comprising:
    in a transmit set of time-domain samples, identifying peak samples and identifying null samples;
    computing, in a processor, an error signal responsive to the peak samples and the null samples;
    producing a reserved tone set of time-domain samples in response to the error signal; and
    adding the reserved tone set of time-domain samples to samples in a user data set of time-domain samples to produce the transmit set of time-domain samples, the transmit set of time-domain samples having a peak-to-average ratio less than a peak-to-average ratio of the user data set of time-domain samples.

2. The method for reducing the peak-to-average ratio according to claim 1 wherein the transmit set of time-domain samples comprise a symbol for transmission in a multi-carrier transmitter, and wherein the identifying peak and identifying null samples comprises:
    identifying peak samples corresponding to one or more of the transmit set of time-domain samples having a value above a high threshold, and identifying null samples corresponding to one or more of the transmit set of time-domain samples having a value below a low threshold;
    and wherein the computing the error signal comprises:
    computing an error signal having values corresponding to a difference depending on the peak samples and the high threshold, and values corresponding to a difference depending on the null samples and the low threshold.

3. The method for reducing a peak-to-average ratio according to claim 1 wherein the producing the reserved tone set of time-domain samples comprises performing a radix r inverse fast Fourier transform (IFFT) having N inputs and N outputs, wherein reserved tone frequency-domain data is input on M selected inputs, and a null value is input on N−M of the N inputs, wherein the M selected inputs are members of a single subgroup at layer x of a butterfly structure used to implement the radix r IFFT, wherein $x=\lceil \log_r M \rceil$.

4. The method for reducing a peak-to-average ratio according to claim 3 wherein the performing a radix r IFFT comprises performing a radix r, decimation-in-time IFFT.

5. The method for reducing a peak-to-average ratio according to claim 1 comprising producing the user data set of time-domain samples by performing a radix r IFFT having N inputs and N outputs, wherein user frequency-domain data is input on N−M of the N inputs, and a null value is input on M selected inputs, wherein the M selected inputs are members of a single subgroup at layer x of a butterfly structure used to implement the radix r IFFT, wherein $x=\lceil \log_r M \rceil$.

6. The method for reducing a peak-to-average ratio according to claim 1 wherein the computing the error signal comprises computing the error signal having positive values corresponding to a difference depending on a square of an absolute value of the peak sample and the high threshold, and negative values corresponding to a difference depending on a square of an absolute value of the null sample and the low threshold.

7. The method for reducing a peak-to-average ratio according to claim 1 comprising filtering the transmit set of time-domain samples in response to the error signal.

8. The method for reducing a peak-to-average ratio according to claim 1 wherein the transmit set of time-domain samples comprises time-domain samples in an orthogonal frequency division multiplexing (OFDM) symbol, and wherein the computing the error signal responsive to the peak samples and the null samples comprises computing the error signal responsive to the peak samples and the null samples in the OFDM symbol.

9. A method for reducing a peak-to-average ratio of a signal comprising:
    in a plurality of samples that correspond to the signal, identifying peak samples and identifying null samples;
    computing, in a processor, an error signal responsive to the peak samples and the null samples; and
    using the error signal to reduce a peak-to-average ratio of the plurality of samples.

10. The method for reducing a peak-to-average ratio of a signal according to claim 9 wherein the using the error signal to reduce a peak-to-average ratio of the plurality of samples comprises filtering the plurality of samples responsive to the error signal.

11. The method for reducing a peak-to-average ratio of a signal according to claim 10 wherein the filtering the plurality of samples comprises using the error signal to adapt an adaptive filter for filtering the plurality of samples.

12. The method for reducing a peak-to-average ratio of a signal according to claim 9 wherein the using the error signal to reduce a peak-to-average ratio of the plurality of samples comprises:
    producing a set of reserved tone samples responsive to the error signal; and
    adding the reserved tone samples to the plurality of samples.

13. The method for reducing a peak-to-average ratio of a signal according to claim 12 wherein the producing a set of reserved tone samples responsive to the error signal comprises:
    producing reserved tone frequency-domain data responsive to the error signal; and performing an inverse fast Fourier transform (IFFT) on the reserved tone frequency-domain data to produce the set of reserved tone samples.

14. The method for reducing a peak-to-average ratio of a signal according to claim 13 wherein the performing an IFFT on the reserved tone frequency-domain data comprises performing an IFFT wherein the reserved tone frequency-domain data is input on evenly spaced inputs of the IFFT to produce the set of reserved tone samples.

15. A system for reducing a peak-to-average ratio of a signal comprising:
a feedback system for computing an error signal responsive to peak samples and null samples in a transmit set of time-domain samples;
an adaptive tone generator coupled to the feedback system for producing a reserved tone set of time-domain samples in response to the error signal; and
an adder coupled to the adaptive tone generator and a data source for adding the reserved tone set of time-domain samples to samples in a user data set of time-domain samples to produce the transmit set of time-domain samples.

16. The system for reducing the peak-to-average ratio according to claim 15 comprising a filter coupled to an output of the adder and to the feedback system for filtering the transmit set of time-domain samples in response to the error signal.

17. The system for reducing the peak-to-average ratio according to claim 15 wherein the adaptive tone generator comprises:
an adaptive tone generator for generating M sets of reserved tone frequency-domain data in response to the error signal; and
an N-point inverse fast Fourier transform (IFFT) coupled to the M sets of reserved tone frequency-domain data for producing the reserved tone set of time-domain samples.

18. A method in a multi-carrier transmitter for reducing a peak-to-average ratio of a signal comprising: in a processor;
producing a reserved tone set of time-domain samples by performing a radix r inverse fast Fourier transform (IFFT) having N inputs and N outputs, wherein reserved tone frequency-domain data is input on M selected inputs, and a null value is input on N−M of the N inputs, wherein the M selected inputs are members of a single subgroup at layer x of a butterfly structure used to implement the IFFT, wherein x=$\lceil \log_r M \rceil$;
producing a user data set of time-domain samples by performing a radix r IFFT having N inputs and N outputs, wherein user frequency-domain data is input on N−M of the N inputs, and a null value is input on the M selected inputs; and
adding the reserved tone set of time-domain samples to the user data set of time-domain samples to produce a transmit set of time-domain samples, wherein the transmit set of time-domain samples has a lower peak-to-average ratio than the user data set of time-domain samples.

19. The method for reducing a peak-to-average ratio according to claim 18 wherein the producing the reserved tone set of time-domain samples comprises producing a reserved tone set of time-domain samples by performing a radix r, decimation-in-time IFFT; and wherein the producing the user data set of time-domain samples comprises producing a user data set of time-domain samples by performing a radix r, decimation-in-time IFFT.

20. The method for reducing a peak-to-average ratio according to claim 18 wherein the producing a reserved tone set of time-domain samples includes performing an IFFT using reserved tone frequency-domain data based upon power magnitudes of peak and null samples in a transmit set of time-domain samples.

* * * * *